(12) United States Patent
Bueb

(10) Patent No.: US 8,510,630 B2
(45) Date of Patent: *Aug. 13, 2013

(54) NIBBLE ENCODING FOR IMPROVED RELIABILITY OF NON-VOLATILE MEMORY

(75) Inventor: Christopher J. Bueb, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/446,359

(22) Filed: Apr. 13, 2012

(65) Prior Publication Data

US 2013/0104000 A1   Apr. 25, 2013

Related U.S. Application Data

(63) Continuation of application No. 11/778,649, filed on Jul. 17, 2007, now Pat. No. 8,161,343.

(51) Int. Cl.
*G11C 29/00* (2006.01)

(52) U.S. Cl.
USPC ............ 714/763; 714/752; 714/755; 714/758

(58) Field of Classification Search
USPC .................................. 714/752, 755, 758, 763
See application file for complete search history.

(56) References Cited

U.S. PATENT DOCUMENTS

| 5,251,219 A | 10/1993 | Babb |
| 5,430,674 A | 7/1995 | Javanifard |
| 5,940,018 A | 8/1999 | Kim et al. |
| 5,944,837 A | 8/1999 | Talreja et al. |

*Primary Examiner* — Sam Rizk
(74) *Attorney, Agent, or Firm* — Kacvinsky Daisak PLLC

(57) ABSTRACT

A wireless device to include a non-volatile memory to execute an encoding scheme to provide single-cell error detection and correction on program operations in which the initial nibble value is Fh and on program operations that result in a nibble value of 0h. The non-volatile memory uses multiple writes to program a nibble more than once with non-zero data between erase cycles.

20 Claims, 8 Drawing Sheets

FIG. 2

FIRST-WRITE NIBBLE CODES

| Nibble | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| Cell-0 | L3 | L0 | L2 | L3 | L2 | L2 | L1 | L3 | L1 | L1 | L3 | L0 | L0 | L1 | L0 | L0 |
| Cell-1 | L3 | L2 | L3 | L0 | L0 | L1 | L0 | L2 | L2 | L1 | L1 | L3 | L1 | L3 | L1 | L0 |
| Cell-2 | L3 | L2 | L2 | L3 | L1 | L0 | L1 | L3 | L2 | L3 | L1 | L1 | L2 | L0 | L0 | L0 |
| Cell-3 | L3 | L3 | L0 | L1 | L2 | L3 | L3 | L0 | L2 | L0 | L2 | L2 | L1 | L1 | L1 | L0 |

ALTERNATIVE RE-WRITEABLE NIBBLE CODES

| Nibble | 1 | 2 | 3 | 4 | 6 | 8 | 9 | C |
|---|---|---|---|---|---|---|---|---|
| Cell-0 | L3 | L3 | L2 | L3 | L2 | L1 | L3 | L0 |
| Cell-1 | L2 | L1 | L0 | L2 | L3 | L3 | L2 | L2 |
| Cell-2 | L3 | L2 | L2 | L1 | L0 | L3 | L2 | L3 |
| Cell-3 | L1 | L3 | L3 | L2 | L2 | L2 | L0 | L2 |

NIBBLE ENCODING FOR IMPROVED RELIABILITY OF NON-VOLATILE MEMORY

RELATED CASE

This application is a Continuation of commonly owned U.S. patent application Ser. No. 11/778,649 titled "Nibble Encoding for Improved Reliability of Non-Volatile Memory", filed Jul. 7, 2007, now U.S. Pat. No. 8,161,343.

Technological developments permit digitization and compression of large amounts of voice, video, imaging, and data information, which may be transmitted from laptops and other digital equipment to other devices within the network. These developments in digital technology and enhancements to applications have stimulated a need for memory storage to handle the higher data volume supplied to these processing devices. Therefore, improved circuits and improved methods are needed to increase the efficiency of memory operations.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2 shows two tables where one table lists first-write nibble codes and the other table shows alternative rewriteable nibble codes;

Figure 1:
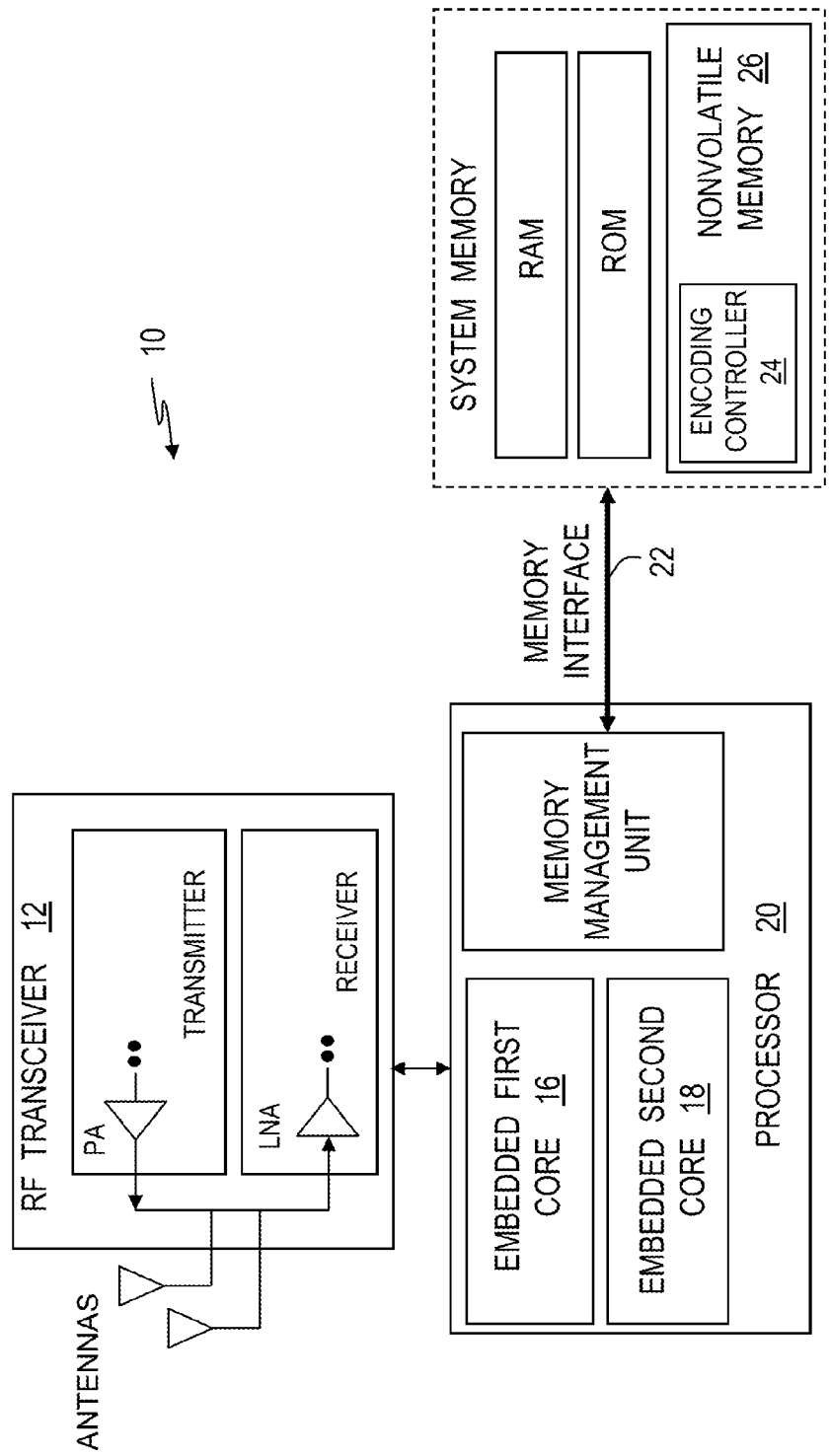
FIG. 1 is a diagram that illustrates a wireless device storing data in a non-volatile memory that incorporates an encoding scheme to allow bit twiddle programming granularity in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Developments in a number of different digital technologies have greatly increased the need to store and transfer data from one device across a network to another system. Technological developments permit digitization and compression of large amounts of voice, video, imaging, and data information, which may be transmitted from laptops and other digital equipment to other devices within the network. The present invention may facilitate applications using higher resolution displays, better image capturing cameras, more storage capability, and new applications for mobile video. As such, the present invention may be used in a variety of products with the claimed subject matter incorporated into desktop computers, laptops, smart phones, MP3 players, USB drives, memory cards, cameras, communicators and Personal Digital Assistants (PDAs), medical or biotech equipment, automotive safety and protective equipment, automotive infotainment products, etc. However, it should be understood that the scope of the present invention is not limited to these examples.

FIG. 1 is a diagram that illustrates an embodiment that couples antenna(s) to a transceiver 12 to accommodate modulation/demodulation. Analog transceiver 12 is coupled with a processor 20 to process functions, execute applications and store results. The processor may include baseband and applications processing functions and utilize one or more processor cores 16 and 18 to allow processing workloads to be shared across the cores. The processor may transfer data through an interface 22 to memory storage in a system memory. In accordance with embodiments of the present invention a policy manager 24 is included within a Non-Volatile Memory (NVM) 26.

The memory cells of the non-volatile memory 26 are multilevel cells (MLC) that greatly increase the density of the memory device. Such MLC cells take advantage of the analog nature of a traditional flash cell to enable storage of multiple bits per memory cell by charging an electrically isolated polysilicon floating gate of the transistor to different levels.

After erasure the threshold voltage of every memory cell transistor in the non-volatile memory may be measured to verify an erased device. The erased state for each cell may be indicated by a designation of "L0". Then, by using a controlled programming technique a precise amount of charge may be placed on the floating gate of selected memory cell transistors to increase the charge to the next charge state or next range that is indicated by a designation of "L1". Additional programming to the next charge state places selected memory cell transistors in a range designated as "L2". The final programmed state or range may be designated as "L3". Thus, four levels of stored gate charge are manifested as four different threshold voltage changes of the memory cell transistor to provide cell storage of two data bits.

Non-volatile memory 26 may be divided or partitioned into logical blocks, pages or sectors. Non-volatile memory allows only unidirectional programming, i.e., programming from an erased condition L0 to the programmed charge states of L1, L2, and L3. Thus, once data is written to a memory cell the entire block, page or sector needs to be erased before modified data is written to this same block, page, or sector, a constraint that is a time consuming sequence of operations and also reduces the life of the non-volatile memory.

In accordance with various features of the present invention, an encoding controller 24 is located within non-volatile memory 26 to alleviate the number of erase operations performed on the memory. One feature of the present invention provides an encoding scheme that allows bit twiddle programming granularity. In accordance with another feature, the present invention provides single-cell error detection and correction on the first write to a nibble as well as writes that bring the nibble data value to 0h. FIGS. 2-8 illustrate steps and processes that an algorithm executed by encoding controller 24 would use to manage non-volatile memory 26.

The table shown in FIG. 2 describes first-write nibble codes that may be programmed to memory cells for nibbles 0h through Fh, and in addition, alternative rewriteable nibble codes. Nibble values 0h-Fh are shown in the rows of the table along with the code represented by the four memory cells Cell-3, Cell-2, Cell-1 and Cell-0, where each memory cell stores one of the level values designated as L3, L2, L1, or L0. By way of example, nibble 0h in the first row of the table is assigned a value of L3, L3, L3, and L3, whereas nibble Fh in the last row is assigned a value of L0, L0, L0, and L0. As seen in the figure, each row in the table presents four memory cells programmed with one of four values that taken collectively; provide the code for one nibble of data. Note that the values for the sixteen first-write nibble codes are chosen to ensure that the codes are orthogonal. Put another way, the nibble code is chosen so that no more than one value stored in a memory cell of a given nibble code can match a stored value in corresponding cells of the other fifteen nibble codes.

It should be noted that there are a number of nibble code assignments that meet certain criteria that is stated within this description. For example, interchanging the columns of the nibble codes in the tables presented in FIG. 2 produce equivalent encoding schemes. Similarly, interchanging nibble values may also produce equivalent encoding schemes.

One criteria of the encoding scheme is that four of the sixteen first-write nibble codes must be rewritable to six different non-zero codes. The figure shows the nibble value Eh having a code of L1, L0, L3, and L1; the nibble value Dh having a code of L1, L3, L1, and L0; the nibble value Bh having a code of L0, L1, L1, and L3; and the nibble value 7h having a code of L3, L1, L0, and L1. These nibble values of Eh, Dh, Bh, and 7h in this solution set are each rewritable to six different non-zero codes, and three of these six codes are rewritable to two different non-zero codes. Note that the nibble values of Eh, Dh, Bh, and 7h have exactly three "1" bits and comprise one L0, two D's and one L3 value. All of these rewritten codes must be either a one-cell-error code of the first-write nibble code with the same nibble value, or a nibble code that is not a one-cell-error code of any of the sixteen first-write nibble codes.

Figure 3:
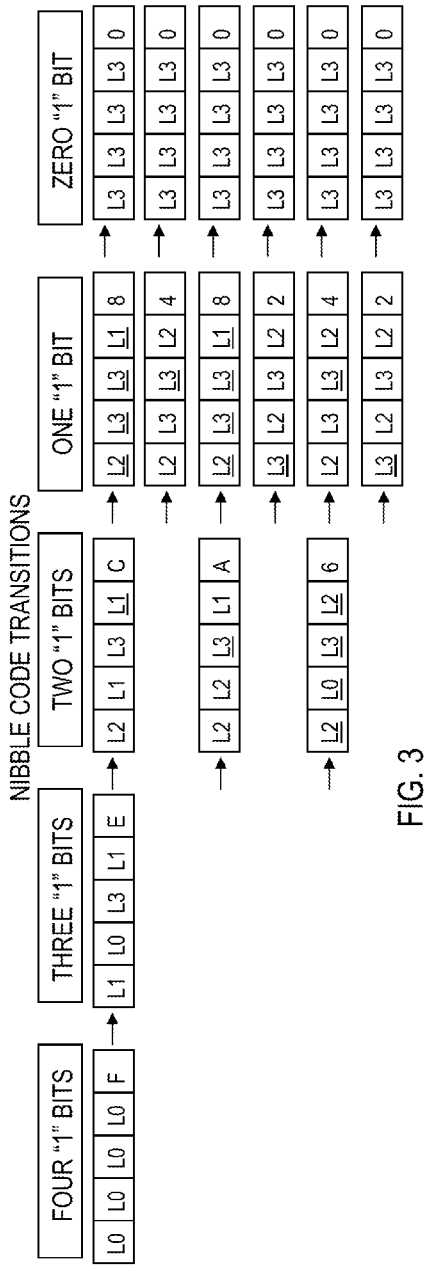
FIGS. 3-6 are diagrams that illustrate nibble code transitions for four different first-write codes.

FIG. 3 illustrates the first of the four nibble values (first presented in FIG. 2) as Eh and shows how the code of L1, L0, L3, and L1 is rewriteable to six different non-zero codes for that nibble value. Specifically, the six non-zero codes are shown as L2, L1, L3, and L1 having a nibble value of Ch; the code of L2, L2, L3 and L1 having a nibble value of Ah; and the code of L2, L0, L3, and L2 having a nibble value of 6h. A memory cell having a level value that is underscored means that the stored value is encoded with a single cell error. If all four cells are underscored then the nibble code is one of the alternate nibble codes listed in FIG. 2.

These three nibble values can collectively be rewritten to the other three nibble values of 8 (encoded as L2, L2, L3, L1), 4 (encoded as L2, L2, L3, L2), and 2 (encoded as L3, L2, L3, L2). Since the latter three nibble values can be rewritten by the former three nibble values, it has been demonstrated that the nibble value of Eh can be rewritten to six different non-zero nibble codes. This also demonstrates that three of the nibble values are rewritable to non-zero nibble values. Furthermore, FIG. 3 shows that each of these rewritable nibbles can be rewritten to exactly two different non-zero nibbles.

Figure 4:
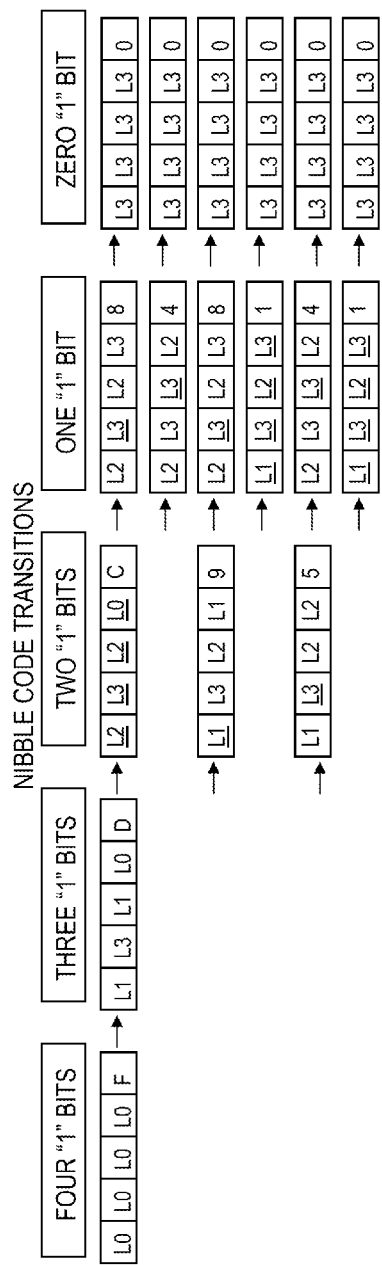

FIG. 4 illustrates the second of the four nibble values (first presented in FIG. 2) as Dh and shows how the code of L1, L3, L1, and L0 is rewriteable to six different non-zero codes for that nibble value. Specifically, the six non-zero codes are shown as L2, L3, L2, and L0 having a nibble value of Ch; the code of L1, L3, L2 and L1 having a nibble value of 9h; the code of L1, L3, L2, and L2 having a nibble value of 5h. Again, a memory cell having a level value that is underscored means that the stored value has an error.

These three nibble values can collectively be rewritten to the other three nibble values of 8h (encoded as L2, L3, L2, L3), 4h (encoded as L2, L3, L3, L2), and 1h (encoded as L1, L3, L2, L3). Since the latter three nibble values can be rewritten by the former three nibble values, it has been demonstrated that the nibble value of Dh can be rewritten to six different non-zero nibble codes. This also demonstrates that three of the nibble values are rewritable to non-zero nibble values. Furthermore, FIG. 4 shows that each of these rewritable nibbles can be rewritten to exactly two different non-zero nibbles.

Figure 5:
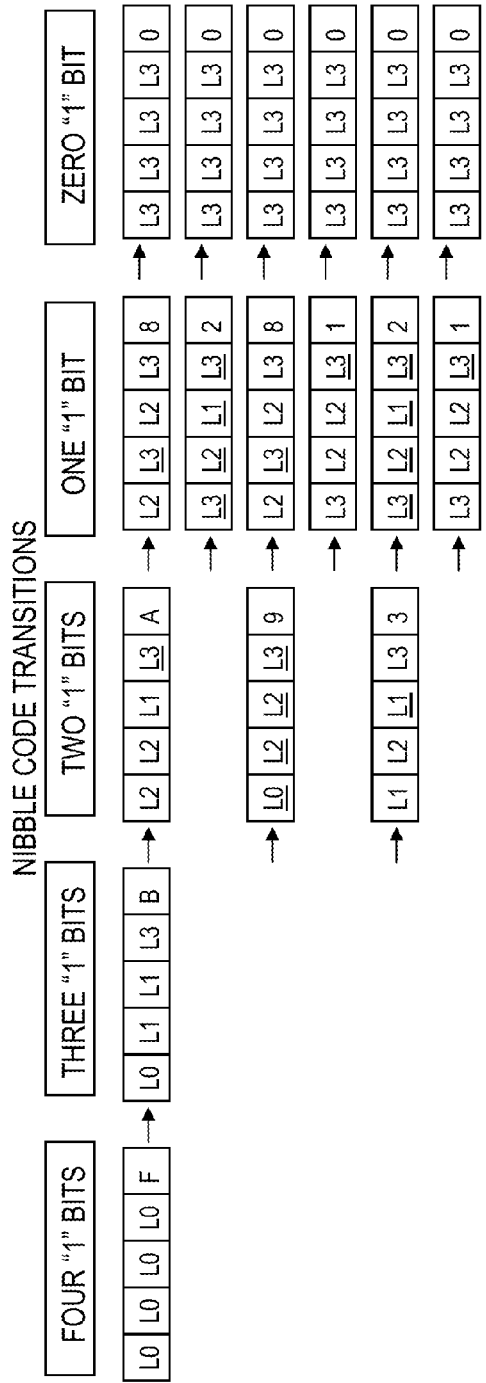

FIG. 5 illustrates the third of the four nibble values (first presented in FIG. 2) as Bh and shows how the code of L0, L1, L1, and L3 is rewriteable to six different non-zero codes for that nibble value. The six non-zero codes are shown as L2, L2, L1, and L3 having a nibble value of Ah; the code of L0, L2, L2 and L3 having a nibble value of 9h; the code of L1, L2, L1, and L3 having a nibble value of 3h.

These three nibble values of Ah, 9h, and 3h can collectively be rewritten to the other three nibble values of 8h encoded as L2, L3, L2, L3, 2h encoded as L3, L2, L1, L3, and 1h encoded as L3, L2, L2, L3. Since the latter three nibble values can be rewritten by the former three nibble values, it has been demonstrated that the nibble value of Bh can be rewritten to six different non-zero nibble codes. This also demonstrates that three of the nibble values are rewritable to non-zero nibble values. FIG. 5 shows that each of these rewritable nibbles can be rewritten to exactly two different non-zero nibble values.

Figure 6:
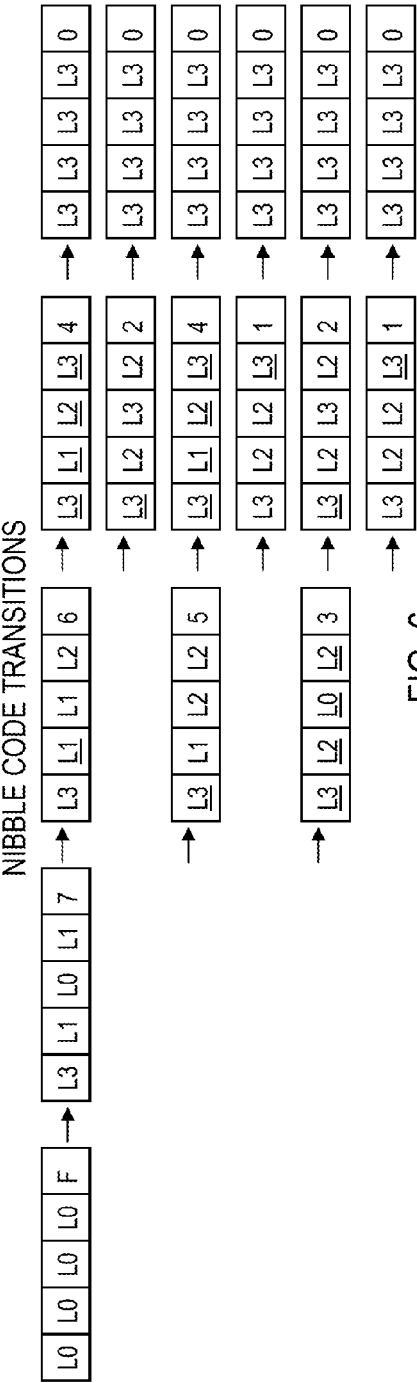

FIG. 6 illustrates the fourth of the four nibble values (first presented in FIG. 2) as 7h and shows how the code of L3, L1, L0, and L1 is rewriteable to six different non-zero codes for that nibble value. The six non-zero codes are shown as L3, L1, L1, and L2 having a nibble value of 6h; the code of L3, L1, L2 and L2 having a nibble value of 5h; the code of L3, L2, L0, and L2 having a nibble value of 3h.

The three nibble values of 6h, 5h, and 3h can collectively be rewritten to the other three nibble values of 4h (encoded as L3, L1, L2, L3), 2h (encoded as L3, L2, L3, L2), and 1h (encoded as L3, L2, L2, L3). Again, since the latter three nibble values can be rewritten by the former three nibble values it has been demonstrated that the nibble value of 7h can be rewritten to six different non-zero nibble codes. This also demonstrates that three of the nibble values are rewritable to non-zero nibble values. Furthermore, FIG. 6 shows that each of these rewritable nibbles can be rewritten to exactly two different non-zero nibble values.

Of the four nibble values Eh, Dh, Bh, and 7h in this solution set that are rewritable to six different non-zero codes, it has been demonstrated that the criteria of the encoding scheme requiring that three of these codes must be successively rewritable to two different non-zero codes has been satisfied. Another criterion that has been clearly satisfied is that all of these rewritten codes must be either a one-cell-error code of the first-write nibble code with the same nibble value, or a nibble code that is not a one-cell-error code of any of the sixteen first-write nibble codes.

Figure 7:
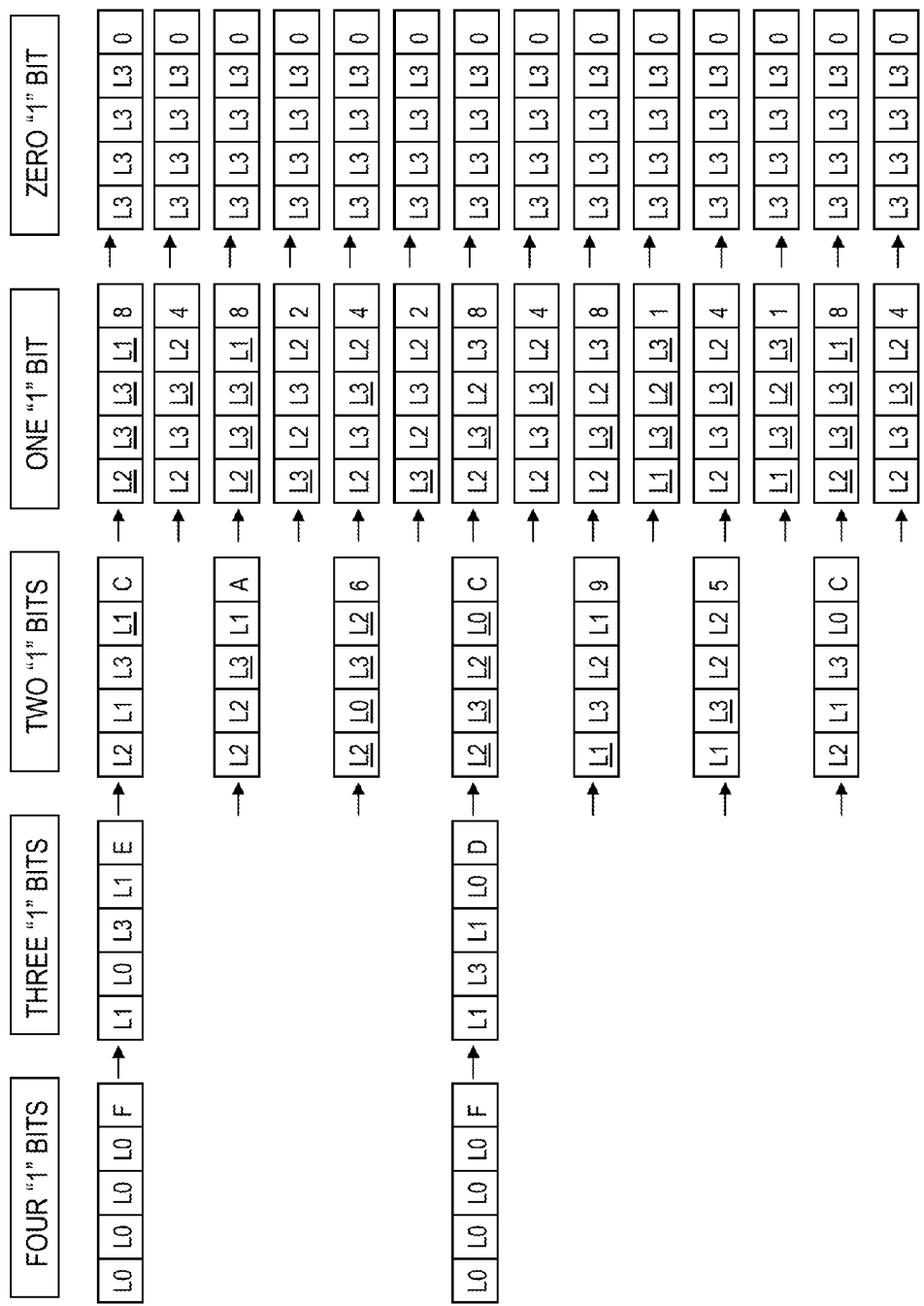
FIGS. 7-9 are diagrams of that show comprehensive nibble code transitions.
Figure 8:
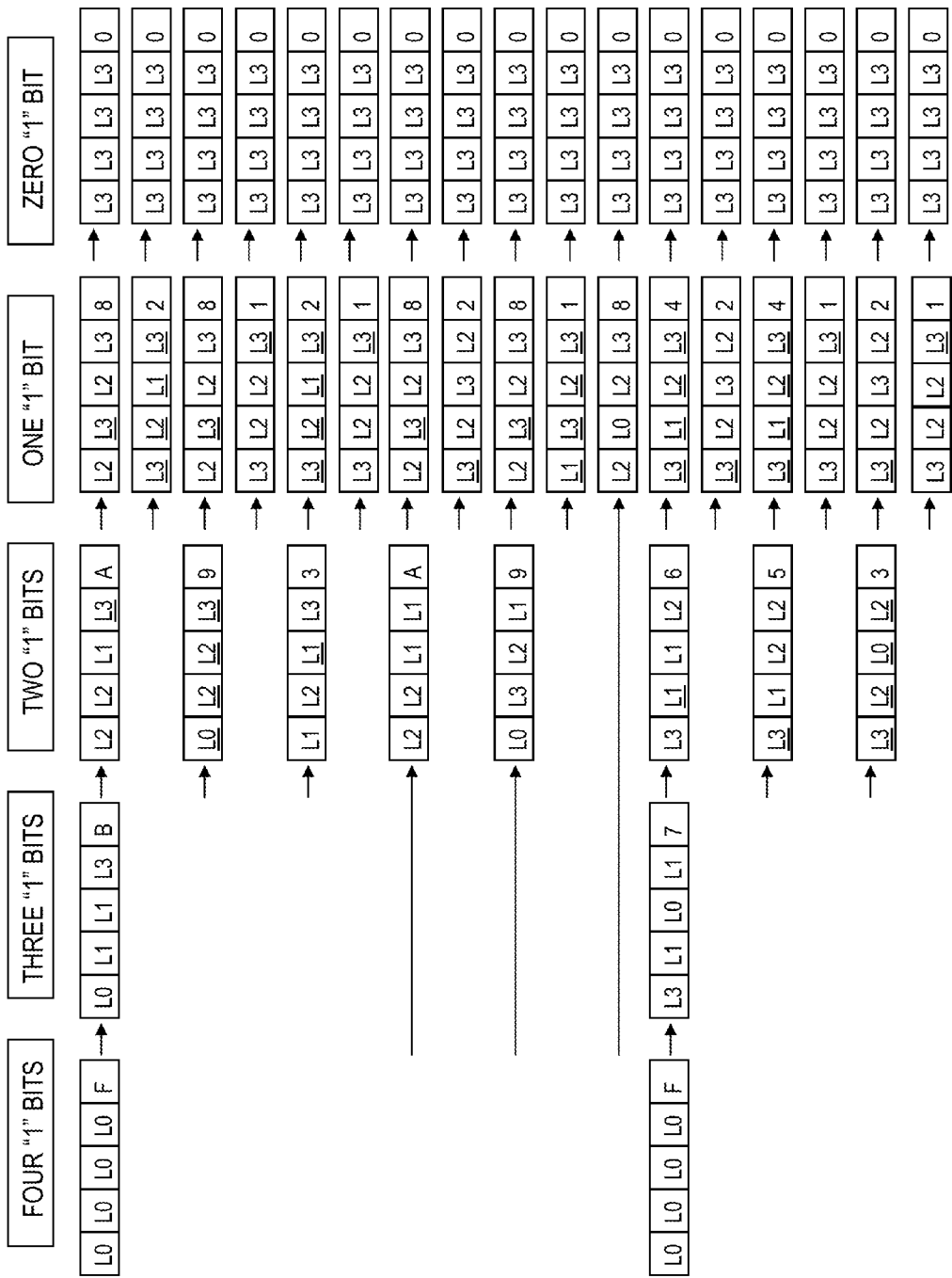
Figure 9:
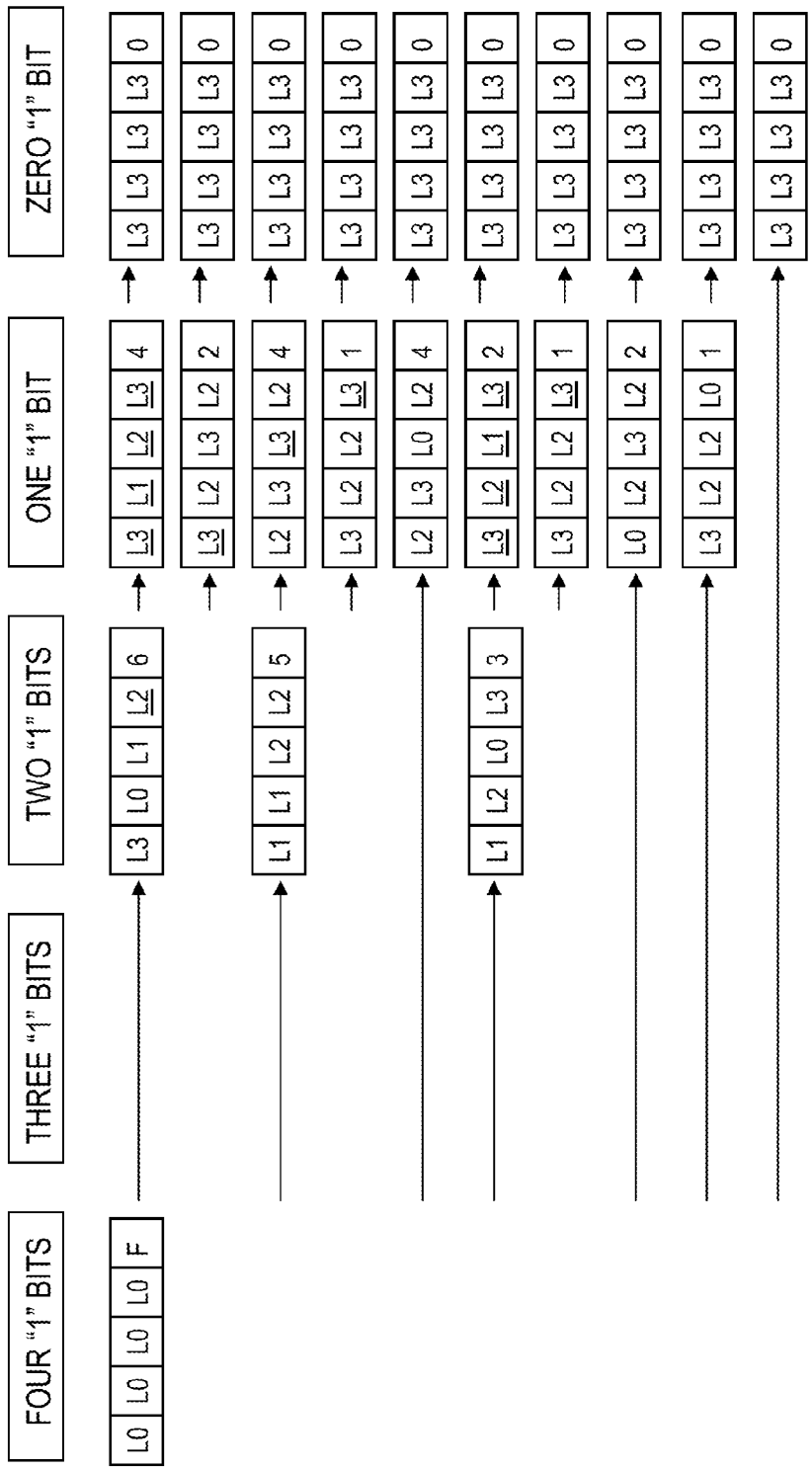

FIGS. 7-9 are diagrams of the comprehensive nibble code transitions in accordance with the present invention. Shown in the figures are the transitions from the erase state of L0, L0, L0, and L0 for the nibble value Fh to the other nibble values in descending order of Eh, Dh, Ch, Bh, Ah, 9h, 8h, 7h, 6h, 5h, 4h, 3h, 2h, 1, and 0h. Thus, the nibble codes for the nibble values listed in FIGS. 7-9 are shown with transitions to the all zero code value denoted by L3, L3, L3, and L3. Note that the figures also include the transitions previously described in FIGS. 2-6.

Another criterion for the encoding scheme is that six of the other first-write nibble codes must be rewritable to two different non-zero codes. Briefly referring to FIGS. 7-9 note that the six nibble codes having the following nibble values: Ch, Ah, 9h, 6h, 5h, and 3h are rewritable to two different non-zero codes. Again, all of these rewritten codes must be either a one-cell-error code of the first-write nibble code with the same nibble value, or a nibble code that is not a one-cell-error code of any of the sixteen first-write nibble codes. Also note that the nibble values of Ch, Ah, 9h, 6h, 5h, and 3h have exactly two "1" bits and the average cell level is 1½, Ch→(2+1+3+0)/4+1½ and Ah→(2+2+1+1)/4+1½. Further note that an alternative rewritable nibble code is made of one L0, two L2's, and one L3.

Yet another criterion for the encoding scheme is that fifteen of the first-write nibble codes must be rewritable to the sixteenth nibble code. This sixteenth nibble code is defined as the zero code of L3, L3, L3 and L3 for the nibble value 0h. Clearly shown in FIGS. 7-9 are the transitions of Fh, Eh, Dh, Ch, Bh, Ah, 9h, 8h, 7h, 6h, 5h, 4h, 3h, 2h, and 1 to the zero code, thus fulfilling this criteria.

Figure 10:
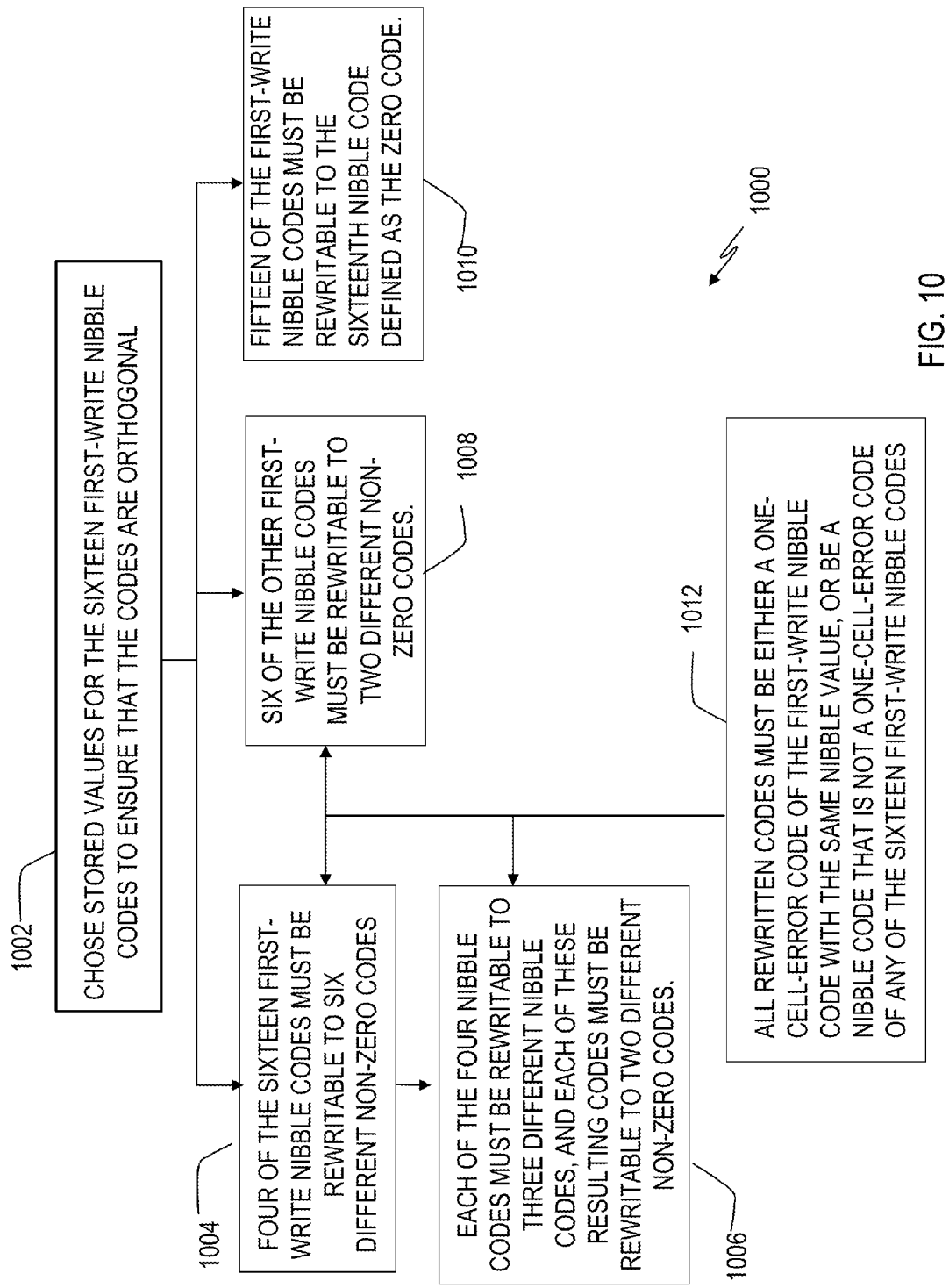
FIG. 10 is a flow diagram that depicts a process and method used by an algorithm to manage the non-volatile memory encoding schemes.

FIG. 10 is a flow diagram that defines rules for encoding memory cells to provide solution sets to mathematical problems. In some embodiments, method 1000, or portions thereof, is performed by encoding controller 24 operating as a state machine, a processor, or an electronic system. Method 1000 is not limited by the particular type of apparatus, software element, or system performing the method. Note that the various actions in method 1000 may be performed in the order presented, or may be performed in a different order.

Method 1000 includes an algorithm process 1002 where stored values are chosen for the sixteen first-write nibble codes to ensure that the codes are orthogonal. In process 1004 four of those sixteen first-write nibble codes must be rewritable to six different non-zero codes. In process 1006 each of the four nibble codes must be rewritable to three different nibble codes, and each of these resulting codes must be rewritable to two different non-zero codes. In process 1008 six of the other first-write nibble codes must also be rewritable to two different non-zero codes. In process 1010 fifteen of the first-write nibble codes must be rewritable to the sixteenth nibble code that is defined as the zero code. Block 1012 stipulates that all rewritten codes must be either a one-cell-error code of the first-write nibble code with the same nibble value, or be a nibble code that is not a one-cell-error code of any of the sixteen first-write nibble codes.

By using the encoding scheme in accordance with the present invention, error correction is provided with an advantage over SBC encoding. The advantage of the present encoding scheme is that it provides single-cell error detection and correction on program operations in which the initial nibble value is Fh and on program operations that result in a nibble value of 0h. In Flash file systems, nibbles are infrequently programmed twice to non-zero data between erase cycles, and therefore, very few bits of data are not protected with error correction using this invention. Various embodiments have been presented that use multiple writes to an advantage and make it possible to program a nibble more than once with non-zero data between erase cycles.

Although prior art byte twiddle allows single-cell error detection, correction, and the flexibility to program a given byte multiple times between erase cycles, that technology only permits an eight-bit boundary. In contrast, the present invention provides first write error protection to a four-bit boundary, and further, bit pairs may be programmed with single-cell error detection and correction for every program operation. Also, the present invention encodes nibble values with three "1" bits, namely Eh, Dh, Bh, and 7h, for maximum reprogram-ability. The present invention encodes the nibble values having a "1" bit, namely 8h, 4h, 2h, and 1h, with minimal reprogram-ability. This encoding scheme allows Nibble Twiddle to emulate SBC programming from a user perspective.

In addition, whereas prior art Nibble Twiddle makes use of mapped nibble states, the present invention utilizes unmapped nibble states. The present invention also enables a useful amount of error correction which significantly enhances the overall reliability of the non-volatile memory in its system application and reliability is improved because significantly fewer memory cells are left unprotected by error correction.

By now it should be apparent that embodiments of the present invention have provided an encoding scheme for a multi-level cell (MLC) non-volatile memory. Criteria for encoding the memory cells has been described to ensure the appropriate solution sets lead to first write error protection on a four-bit boundary and bit pairs may be programmed with single-cell error detection and correction for every program operation.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. An apparatus comprising:
a multicore processor; and
a non-volatile memory device having a plurality of multi-level memory cells and an encoder controller to:
choose a set of first-write nibble codes for an encoding scheme so that no more than one level value stored in a multilevel memory cell of a given nibble code can match a level value in corresponding multilevel memory cells of other nibble codes included in the set of first-write nibble codes and a subset of the set of first-write nibble codes are rewritable to multiple different non-zero nibble codes; and
use the encoding scheme to provide first-write error protection to a four-bit boundary on the non-volatile memory device.

2. The apparatus of claim 1, comprising one or more of the multiple different non-zero nibble codes successively rewritable to two different non-zero codes.

3. The apparatus of claim 1, comprising the encoder controller to ensure that all of the nibble codes in the subset of first-write nibble codes are rewritten to nibble codes that are one-cell-error nibble codes of first-write nibble codes with same nibble values.

4. The apparatus of claim 1, comprising the encoder controller to ensure that a nibble code is not a one-cell-error nibble code of any of the set of first-write nibble codes.

5. The apparatus of claim 1, multiple first-write nibble codes other than those in the subset of first-write nibble codes are rewritable to two different non-zero nibble codes.

6. The apparatus of claim 1, all but a single nibble code of the first-write nibble codes are rewritable to the single nibble code.

7. The apparatus of claim 6, the single nibble code is a zero nibble code.

8. A method comprising:
choosing, at an encoder controller for a non-volatile memory device, a set of first-write nibble codes for an encoding scheme, the set chosen so that no more than one level value stored in a multilevel memory cell of a given nibble code can match a level value in corresponding multilevel memory cells of other nibble codes included in the set and a subset of the set of first-write nibble codes are rewritable to multiple different non-zero nibble codes; and using the encoding scheme to provide first-write error protection to a four-bit boundary on the non-volatile memory device.

9. The method of claim 8, comprising one or more of the multiple different non-zero nibble codes successively rewritable to two different non-zero codes.

10. The method of claim 8 comprising:
ensuring that all of the nibble codes in the subset of first-write nibble codes are rewritten to nibble codes that are one-cell-error nibble codes of first-write nibble codes with same nibble values.

11. The method of claim 10, the set of first-write nibble codes comprises sixteen first-write nibble codes, each first-write nibble code to include a given nibble value from 0h to Fh.

12. The method of claim 11, the subset comprises four first-write nibble codes having nibble code values of Eh, Dh, Bh, and 7h.

13. The method of claim 11, six first-write nibble codes from the set of first-write nibble codes other than those in the subset are rewritable to two different non-zero codes, the six first-write nibble codes having nibble code values of Ch, 9h, 6h, 5h, and 3h.

14. The method of claim 8 comprising:
ensuring that a nibble code is not a one-cell-error nibble code of any of the set of first-write nibble codes.

15. The method of claim 8, all but a single nibble code of the first-write nibble codes are rewritable to the single nibble code.

16. The method of claim 15, the single nibble code is a zero nibble code.

17. A system comprising:
a wireless interface having an antenna;
a multicore processor; and
a non-volatile memory having multilevel memory cells and an encoder controller to provide first-write error protection to a four-bit boundary for first-write nibble codes programmed to the multilevel memory cells, each of the multilevel memory cells placeable into any of more than two charge states, each first-write nibble code including four code cells, each code cell corresponding to a multilevel memory cell and comprising a level value included in a set of more than two level values corresponding to the more than two charge states, each level value in the set of more than two level values corresponding to one of the more than two charge states.

18. The system of claim 17, the encoder controller to program bit pairs with single-cell error detection and correction for every program operation.

19. The system of claim 17, the encoder controller to execute an encoding scheme that has bit twiddle programming granularity.

20. The system claim 17, the encoder controller to perform single-cell error detection and correction on a first write to a nibble and transition writes that bring a value for the nibble to a zero value.

* * * * *

UNITED STATES PATENT AND TRADEMARK OFFICE
CERTIFICATE OF CORRECTION

| | | |
|---|---|---|
| PATENT NO. | : 8,510,630 B2 | Page 1 of 1 |
| APPLICATION NO. | : 13/446359 | |
| DATED | : August 13, 2013 | |
| INVENTOR(S) | : Christopher J. Bueb | |

It is certified that error appears in the above-identified patent and that said Letters Patent is hereby corrected as shown below:

In the Specification

Column 1, line 9, delete "Jul. 7," and insert -- Jul. 17, --, therefor.

In the Claims

Column 8, line 28, in claim 20, after "system" insert -- of --.

Signed and Sealed this
Nineteenth Day of August, 2014

Michelle K. Lee
*Deputy Director of the United States Patent and Trademark Office*